Jan. 17, 1956

B. ANTHUN

RADIO RECEIVER WITH AUTOMATIC GAIN CONTROL FOR AUDIO STAGE

Filed Sept. 13, 1954

2,731,558

INVENTOR.
Bjarne Anthun
BY
Mueller & Aichele
Attys.

United States Patent Office 2,731,558

Patented Jan. 17, 1956

2,731,558

RADIO RECEIVER WITH AUTOMATIC GAIN CONTROL FOR AUDIO STAGE

Bjarne Anthun, Chicago, Ill., assignor to Motorola, Inc., Chicago, Ill., a corporation of Illinois Application September 13, 1954, Serial No. 455,377

5 Claims. (Cl. 250—20)

Figure 1:
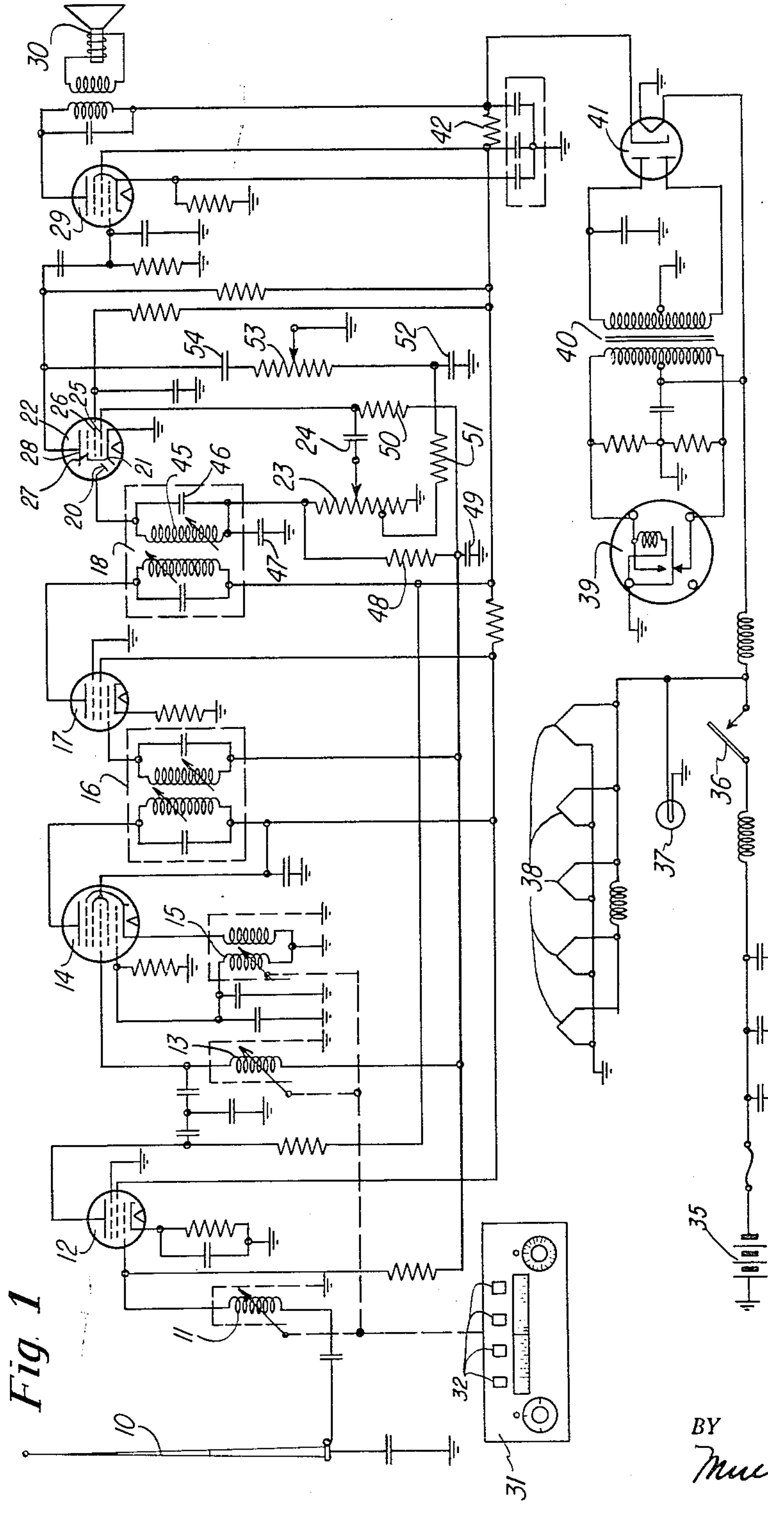

This invention relates generally to automatic volume control systems for radio receivers, and more particularly to a system for use in radio receivers such as mobile receivers wherein the received signal level is subject to wide variations for holding the reproduced audio signals at a substantially constant level.

Although automatic volume control systems are commonly used with radio receivers, the systems generally used only partly equalize the audio volume in response to wide ranges in received signal level, and do not actually hold the volume constant during such changes. These systems are generally adequate when signal levels change only to a small extent as in radios used at fixed positions such as in a home. However, in other applications such as mobile radios, as used in automobiles which may continuously move with respect to the station being received, and may also move with respect to objects such as tall buildings, viaducts and the like which attenuate the waves from the station, very wide changes in signal strength are encountered at the receiver antenna or input. Standard automatic volume control systems will not compensate for such changes to provide constant audio output at the receiver.

Variations in audio level which require adjustment of the manual volume control is particularly objectionable in automobile radios as the driver may also be operating the radio set, and he must divert his attention from driving to operate the manual volume control. Further, because of the relatively high noise level in vehicles, the volume of a radio therein must be held within relatively close limits to permit persons to hear while at the same time keeping the level from becoming objectionably high. Also to simplify the operation of automobile radio sets automatic tuning means are frequently provided, and as the receiver is automatically tuned from one station to another, it is desired that the volume also be automatically adjusted so that further operation of the receiver is not required.

It is therefore an object of the present invention to provide an improved automatic volume control system for mobile radio sets.

A further object of this invention is to provide an automatic volume control system for a radio receiver which provides full correction for variations in level of received signals so that the audio output remains constant after being once set.

A feature of the invention is the provision of a radio receiver wherein automatic volume control voltage is applied to the first audio frequency amplifier of the receiver as well as to the radio frequency and intermediate frequency stages of the receiver. By deriving the automatic volume control voltage from the output of the intermediate frequency amplifier, the signal level at the intermediate frequency amplifier output will be partially corrected, and further correction in the audio amplifier will hold the signal level completely constant.

A further feature of the invention is the provision of a simple circuit providing audio detection, automatic volume control, and audio amplification including a single tube having a remote cutoff pentode section and a diode section, with the diode section being connected in a detector circuit for deriving the audio signals which are applied through a condenser to the control grid of the pentode, and also providing a negative voltage varying with signal level which is applied through a resistor to the control grid of the pentode to provide a steady control in the gain thereof.

Figure 2:
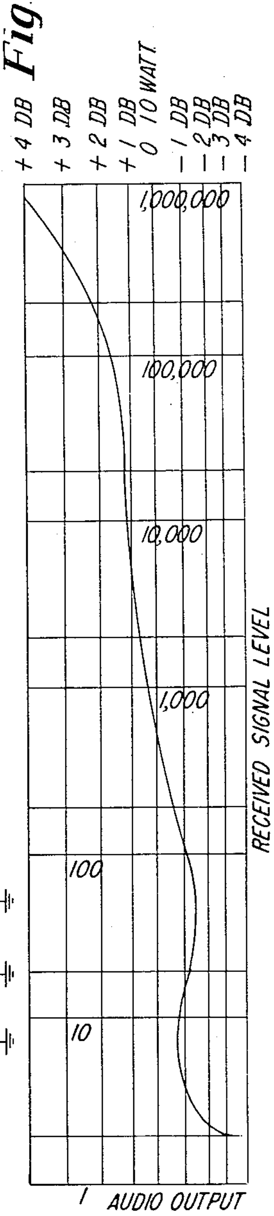

Further objects, features and the attending advantages of the invention will be apparent from a consideration of the following description when taken in connection with the accompanying drawings in which:

Fig. 1 is a circuit diagram of a radio receiver in accordance with the invention; and Fig. 2 is a curve showing the operation of the system in accordance with the invention.

In practicing the invention there is provided a radio receiver for mobile use such as a receiver for installation in an automobile, and which receiver may have automatic tuning means for selecting the station to be received. The receiver is of the superheterodyne type and includes a detector circuit at the output of the intermediate frequency amplifier for deriving the audio modulating voltage and also a direct current voltage which varies with signal level. The detector circuit utilizes a single diode section which is included in the same envelope as a pentode section of the remote cutoff type. The audio voltage from the detector circuit is applied from a volume control potentiometer through a coupling capacitor to the signal grid of the pentode audio amplifier section. A negative direct current voltage varying with the strength of the intermediate frequency waves is derived from a long time constant filter coupled to the detector circuit and is applied through a resistor to the control grid of the pentode. The automatic volume control voltage is also applied to the radio frequency and intermediate frequency stages of the receiver. It is well-known that the automatic volume control voltage derived from the output of the intermediate frequency amplifier when applied to the preceding stages can only tend to hold the signals at the output thereof constant as if the action was made to hold the level completely constant objectionable regeneration would take place. However, by applying the automatic volume control voltage also to the first audio stage, complete correction can be maintained. This is highly important in automatic radio receivers as fully set forth above and is accomplished in an extremely simple circuit which does not add substantially to the cost of the receiver.

Referring now to the drawings, in Fig. 1 there is illustrated a radio receiver for mobile use such as for installation in an automobile. A whip antenna 10 is illustrated as is normally used in an automobile radio. The received signals are selected by a tuning element 11 and applied to radio frequency amplifier 12. The signals at the output of amplifier 12 may be further selected by a tuning element 13 and then applied to converter 14 which produces local oscillations, the frequency of which is controlled by tuning element 15. The fixed intermediate frequency from the converter 14 is selected by a tuned circuit 16 and applied to intermediate frequency amplifier 17. The signal at the output of the intermediate frequency amplifier 17 is applied between the plate 20 and cathode 21 of the tube 22. Due to the rectifying action of the plate 20, a voltage is developed across potentiometer 23 which corresponds to the amplitude modulation of the intermediate frequency wave selected by the circuit 18.

Audio signals are derived from a tap on potentiometer 23 and are applied through condenser 24 to the control grid 25 of the tube 22. The control grid 25 is positioned in an electron stream which extends from the cathode 21 through screen grid 26 and suppressor grid 27 to the anode 28. The amplified audio signals at the plate 28 are applied to the audio output stage 29 and from the output stage to the loud speaker 30 or other sound reproducer.

An automatic tuning unit 31 may be provided for simultaneously controlling the tuning elements 11, 13 and 15 which select the frequency of the station received. This automatic tuning element may be push button controlled so that any one of a number of preset stations may be selected by merely operating a push button 32. The tuner 31 may be of the signal seeking type which operates from the strength of the signal received to stop the tuning at successive stations of a predetermined level. In either case the tuning may be performed by merely pushing a button and it is desired that the audio output remain at the desired value as the receiver is tuned from one station to another.

Power for the receiver may be derived from a vehicle battery as illustrated at 35 in Fig. 1. The battery power may be applied through a filter to switch 36 from which two circuits extend; one to the pilot light 37 and the heaters 38 of the various tubes in the receiver circuit, and the other to the vibrator power supply including interrupter 39, transformer 40, and rectifier 41. The rectified voltage is applied through filter 42 to the plate loads of the tubes of the receiver.

Considering the detector and audio amplifier circuit more specifically, the intermediate frequency voltage induced in coil 45 of the tuned circuit 18 is applied to a series circuit including the anode 20 and cathode 21 of the tube 22 and the resistance unit of the potentiometer 23. Condenser 46 is provided for tuning the coil 45, and condenser 47 is connected in parallel to the resistance of the potentiometer 23. The condenser 47 and the resistance 23 have values which provide a relatively short time constant so that the dynamic variations in the amplitude of the intermediate frequency wave resulting from modulation thereof, and also slow changes in the amplitude of the wave resulting from changes of the received signal strength are developed across the resistance 23. As previously stated, the dynamic variations or audio are applied through condenser 24 to the grid 25 of tube 22. The slow variations in the voltage across resistance 23 are derived by a filter formed by resistor 48 and condenser 49 which produce a long time constant. Accordingly a negative control voltage is developed across condenser 49 which varies with the strength of the received wave. This voltage is applied through resistor 50 to the grid 25 of the tube 22 to control the gain of this tube. The grid 25 must be of the remote cutoff type so that the gain may be controlled over a wide range as the voltage across condenser 49 varies. The voltage across condenser 49 is also applied to the signal grids of the tubes 12, 14 and 17 to control the signal gain in these tubes.

Although it is not part of the present invention, there is provided in the audio amplifier stage including the tube 20, a tone control circuit formed by resistor 51 (connected to a tap on the resistance of the potentiometer 23), condenser 52, potentiometer 53, and condenser 54 (connected to the plate 28 of the tube 22). The movable tap on potentiometer 53 is connected to ground and movement thereof affects both the frequency response of the volume control potentiometer 23 and the output at the anode 28 to selectively attenuate predetermined frequencies.

As previously stated, the gain control action produced in the radio frequency and intermediate frequency stages cannot be made to hold the signal level at the output of the intermediate frequency amplifier constant without producing objectionable effects in the radio receiver circuit. However, by supplementing this automatic gain control action by further action in the first audio frequency stage, gain control action can be provided, which completely compensates for changes in signal level to hold the audio output at a value which is almost exactly constant. This is shown in the curve of Fig. 2 wherein the ordinate shows received signal level and the abscissa shows audio output. It will be noted that received signals varying from 5 to 100,000 microvolts causes a variation in the audio output of only plus or minus 1.5 decibels. This is a very small output variation for such a wide variation of input signals.

The following values have been used in the audio detector and amplifier circuit illustrated in Fig. 1 and have provided highly satisfactory operation.

| | |
|---|---|
| Tube 22 | 6CR6 |
| Inductor 45 | 1045 microhenries |
| Condenser 46 | 107 micromicrofarads |
| Potentiometer 23 | 250,000 ohms with tap at 125,000 ohms |
| Condenser 47 | 100 micromicrofarads |
| Resistor 48 | 1 megohm |
| Condenser 49 | .05 microfarad |
| Condenser 24 | .01 microfarad |
| Resistor 50 | 2.2 megohms |
| Resistor 51 | 15,000 ohms |
| Condenser 52 | .02 microfarad |
| Potentiometer 53 | 1 megohms |
| Condenser 54 | 1,000 micromicrofarads |

It is to be pointed out that these values are merely illustrative of one circuit and that variations in the values and also changes in the circuit connections can be made within the teachings of the invention.

Automobile radio receivers using the circuit illustrated in Fig. 1 with the values set forth above have been thoroughly tested and have been found to provide highly satisfactory operation. The audio output of these receivers has remained constant within very small limits as the vehicles have passed under viaducts or beside tall buildings which substantially attenuate the radio waves from the station being received. Also, when driving across country, the volume is held constant as the vehicle either goes away from or approaches a station so that manual control is not required which might divert the driver's attention from operation of the vehicle. Further, the circuit has held the audio output constant within very small limits when the receiver is automatically tuned from one station to another even though one station might be quite close and provide a strong signal and the other station may be distant and provide only a weak signal. By using a combined tube including diode and pentode sections, the cost of the receiver is not substantially greater than that of standard receivers which do not have automatic gain control action in the audio stage.

I claim:

1. In a radio receiver of the superheterodyne type adapted to be used to receive amplitude modulated waves of widely varying strengths, a combined detector-amplifier circuit including in combination, an electron discharge valve having a cathode, an anode, a remote cutoff control grid, a secreen grid and a suppressor grid, said valve also having an auxiliary anode cooperating with said cathode and forming an electron path outside the electron path to said first anode, a detector circuit connected between said cathode and said auxiliary anode for applying an amplitude modulated intermediate frequency wave thereto, a volume control potentiometer in said detector circuit including resistance means having one terminal coupled to said auxiliary anode so that a voltage wave is developed across said resistance means in response to amplitude variations of the intermediate frequency wave, said potentiometer having a movable tap engaging said resistance means, condenser means connecting said movable tap of said potentiometer to said control grid for applying thereto at least a portion of the alternating current component of said voltage wave developed across said potentiometer, filter means connected to said one terminal of said resistance means for deriving the direct current component from said voltage wave thereacross and including second condenser means across which a negative direct current voltage is developed varying with the strength of the intermediate frequency wave, and second resistance means connecting said second condenser means to said control grid for applying said varying direct current voltage thereto to control the gain of said valve in accordance with the strength of the intermediate frequency wave.

2. In a radio receiver of the superheterodyne type adapted to be used to receive amplitude modulated waves of widely varying strengths, which receiver includes frequency converting and amplifying means for producing an intermediate frequency wave and with the gain of said means depending upon the value of a control voltage applied thereto, a combined detector-amplifier circuit including in combination, an electron discharge valve having a cathode, an anode, a remote cutoff control grid, a screen grid and a suppressor grid, said valve also having an auxiliary anode cooperating with said cathode and forming an electron path outside the electron path to said first anode, a detector circuit connected between said cathode and said auxiliary anode for applying an amplitude modulated intermediate frequency wave thereto, a volume control potentiometer in said detector circuit including resistance means having one terminal coupled to said auxiliary anode so that a voltage wave is developed across said resistance means in response to amplitude variations of the intermediate frequency wave, said potentiometer having a movable tap engaging said resistance means, condenser means connecting said movable tap of said potentiometer to said control grid for applying thereto at least a portion of the alternating current component of said voltage wave developed across said potentiometer, filter means connected to said one terminal of said resistance means and including second condenser means across which a negative direct current control voltage is developed varying with the strength of the intermediate frequency wave, second resistance means connecting said second condenser means to said control grid for applying said varying direct current control voltage thereto to control the gain of said valve in accordance with the strength of the intermediate frequency wave, and means coupled to said second condenser means for applying said direct current control voltage to the frequency converting and amplifying means of said receiver for controlling the gain thereof.

3. In a mobile radio receiver of the superheterodyne type adapted to be moved between different positions at which the signals to be received are of varying strengths, and adapted to be automatically tuned to transmitting stations which provide signals of varying strength, a combined detector-amplifier circuit including in combination, an electron discharge valve having a cathode, an anode, a remote cutoff control grid, a screen grid and a suppressor grid, said valve also having an auxiliary anode cooperating with said cathode and outside the electron stream to said first anode, a detector circuit connected between said cathode and said auxiliary anode for applying an amplitude modulated intermediate frequency wave thereto, a volume control potentiometer in said detector circuit including resistance means having a movable tap thereon, said resistance means having one terminal coupled to said auxiliary anode so that a voltage wave is developed across said resistance means corresponding to amplitude modulation of the intermediate frequency wave and to the amplitude of said intermediate frequency wave, condenser means connecting said movable tap of said potentiometer to said control grid for applying thereto a portion of the alternating current voltage developed across said potentiometer, filter means connected to said one terminal of said resistance means and including second condenser means across which a negative direct current voltage is developed varying with the strength of the intermediate frequency wave, and second resistance means connecting said second condenser means to said control grid for applying said varying direct current voltage thereto to reduce the gain of said valve as the strength of the intermediate frequency wave increases.

4. In a radio receiver of the superheterodyne type adapted to be used to receive amplitude modulated waves of widely varying strengths, a combined detector-amplifier circuit including in combination, an electron discharge valve having a cathode, an anode, a remote cutoff control grid, a screen grid and a suppressor grid forming a first section, said valve also having an auxiliary anode positioned with respect to said cathode to form a second section outside the electron stream of said first section, a source of amplitude modulated intermediate frequency waves, a detector circuit connected to said source including said second section of said electron discharge valve, said detector circuit including first resistance means connected in series therein having a first terminal coupled to said auxiliary anode and a second terminal connected to a reference potential, means connecting said cathode to said reference potential, first condenser means connected across said first resistance means and forming therewith a load circuit across which a voltage wave is developed which varies with variations in amplitude of the intermediate frequency wave, said resistance means having a movable tap thereon, second condenser means connecting said movable tap to said control grid for applying thereto at least a portion of the alternating current voltages developed across said load circuit, filter means connected to said load circuit including a second resistor means and third condenser means connected in series between said first terminal of said resistor means and said reference potential, so that a negative direct current voltage is developed across said third condenser means which varies with the strength of the intermediate frequency wave, and third resistor means connecting said third condenser means to said control grid for applying said varying negative direct current voltage thereto to reduce the gain of said first section of said valve as the strength of the intermediate frequency wave increases.

5. In a radio receiver of the superheterodyne type adapted to be moved between different positions at which the signals to be received are of varying strengths, and adapted to be automatically tuned to transmitting stations which provide signals of varying strength, a combined detector-amplifier circuit including in combination, an electron discharge valve having a cathode, an anode, a remote cutoff control grid, a screen grid and a suppressor grid forming a first section, said valve also having an auxiliary anode positioned with respect to said cathode to form a second section outside the electron stream of said first section, a source of amplitude modulated intermediate frequency waves including a tuned circuit, a detector circuit including first resistance means and first condenser means connected in parallel, said detector circuit having one terminal thereof connected to said tuned circuit and the other terminal connected to said cathode of said valve, means connecting said auxiliary anode of said valve to said tuned circuit so that a series circuit is formed and a voltage wave is developed across said resistance means corresponding to amplitude variations of the intermediate frequency wave, said first resistance means having a movable tap thereon, second condenser means connecting said movable tap to said control grid for applying thereto at least a portion of the alternating current voltages developed across said first resistance means, filter means coupled between said one terminal of said first resistance means and said cathode of said valve, said filter means including second resistor means and third condenser means connected in series with said third condenser means having the terminal thereof remote from said second resistor means connected to said cathode so that a negative direct current voltage is developed across said third condenser means which varies with the strength of the intermediate frequency wave, and third resistor means connecting the junction between said second resistor means and said third condenser means to said control grid for applying said varying negative direct voltage thereto to reduce the gain of said first section of said valve as the strength of the intermediate frequency wave increases.

References Cited in the file of this patent

UNITED STATES PATENTS

| | | |
|---|---|---|
| 2,045,569 | Case | June 30, 1936 |
| 2,085,405 | Welch et al. | June 29, 1937 |
| 2,125,468 | Sinninger | Aug. 2, 1938 |
| 2,326,737 | Andrews | Aug. 17, 1943 |